United States Patent
Engholm et al.

(10) Patent No.: US 9,784,765 B2
(45) Date of Patent: Oct. 10, 2017

(54) GRAPHIC ACTUATION OF TEST AND MEASUREMENT TRIGGERS

(75) Inventors: Kathryn A. Engholm, Portland, OR (US); Cecilia A. Case, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 483 days.

(21) Appl. No.: 12/611,302

(22) Filed: Nov. 3, 2009

(65) Prior Publication Data

US 2010/0235131 A1   Sep. 16, 2010

Related U.S. Application Data

(60) Provisional application No. 61/160,211, filed on Mar. 13, 2009, provisional application No. 61/160,209, filed on Mar. 13, 2009.

(51) Int. Cl.
*G01D 3/00* (2006.01)
*G01R 13/02* (2006.01)

(52) U.S. Cl.
CPC ....... *G01R 13/0254* (2013.01); *G01R 13/029* (2013.01)

(58) Field of Classification Search
CPC .......................... G01R 13/029; G01R 13/0254
USPC ................... 702/108, 123; 716/102; 704/252
See application file for complete search history.

(56) References Cited

U.S. PATENT DOCUMENTS

| | | | |
|---|---|---|---|
| 4,783,803 A * | 11/1988 | Baker et al. | 704/252 |
| 4,975,636 A * | 12/1990 | Desautels | G01R 13/24 324/121 R |
| 6,570,592 B1 | 5/2003 | Sajdak et al. | |
| 6,615,369 B1 | 9/2003 | Beck et al. | |
| 7,134,109 B2 * | 11/2006 | Hayles | 716/102 |
| 2005/0261847 A1 | 11/2005 | Nara | |

(Continued)

FOREIGN PATENT DOCUMENTS

| | | |
|---|---|---|
| CN | 1936614 | 3/2007 |
| DE | 10047612 A1 | 8/2001 |

(Continued)

OTHER PUBLICATIONS

U.S. Appl. No. 12/568,141, filed Sep. 28, 2009.

(Continued)

*Primary Examiner* — Toan Le
*Assistant Examiner* — Xiuquin Sun
(74) *Attorney, Agent, or Firm* — Marger Johnson; Kevin Dothager; Matt Rabdau (57) ABSTRACT

A system and method are provided for graphically actuating a trigger in a test and measurement device. The method includes displaying a visual representation of signal properties for one or more time-varying signals. A graphical user input is received, in which a portion of the visual representation is designated. The method further includes configuring a trigger of the test and measurement device in response to the graphical user input, by setting a value for a trigger parameter of the trigger. The set value for the trigger parameters varies with and is dependent upon the particular portion of the visual representation that is designated by the graphical user input. The trigger is then employed in connection with subsequent monitoring of signals within the test and measurement device.

22 Claims, 8 Drawing Sheets

(56) References Cited

U.S. PATENT DOCUMENTS

| | | | |
|---|---|---|---|
| 2007/0129888 A1* | 6/2007 | Rosenberg | G01C 21/20 701/433 |
| 2007/0282542 A1 | 12/2007 | Duff et al. | |
| 2009/0281759 A1* | 11/2009 | Cake et al. | 702/123 |

FOREIGN PATENT DOCUMENTS

| | | |
|---|---|---|
| EP | 1755025 A2 | 2/2007 |
| EP | 2058668 A1 | 5/2009 |
| WO | 2009143466 A2 | 11/2009 |

OTHER PUBLICATIONS

U.S. Appl. No. 12/573,026, filed Oct. 2, 2009.
U.S. Appl. No. 13/039,062, filed Mar. 2, 2011.
U.S. Appl. No. 12/790,403, filed May 28, 2010.

* cited by examiner

SCOPE TRACE
TIME-QUALIFIED TRIGGER

FIG. 12

OSCILLOSCOPE
SETUP AND HOLD TRIGGER

GRAPHIC ACTUATION OF TEST AND MEASUREMENT TRIGGERS

CROSS-REFERENCE TO RELATED APPLICATION(S)

This application claims priority from U.S. Provisional Patent Application No. 61/160,211, filed Mar. 13, 2009, the disclosure of which is hereby incorporated by reference in its entirety and for all purposes.

BACKGROUND

A variety of test and measurement devices exist for use with varying types of signals. Test and measurement operations in these devices are often controlled using triggering methods. For example, in the case of discovering and capturing signal events for subsequent study, signal captures can be initiated based on a trigger that is activated when certain signal characteristics are observed or otherwise detected. Use of such a trigger conserves computing resources by only capturing signals that may potentially be of interest.

Although existing triggers are adequate in many cases, a variety of common signal situations exist that cannot be effectively detected by existing triggers. In addition, many existing triggering methods are imprecise, difficult to configure, or otherwise limit the ability to identify and trigger upon signal events of interest.

SUMMARY

Accordingly, the present disclosure provides a system and method for graphically actuating a trigger in a test and measurement device. The method includes displaying a visual representation of signal properties for one or more time-varying signals. A graphical user input is received, in which a portion of the visual representation is designated. The method further includes configuring a trigger of the test and measurement device in response to the graphical user input, by setting a value for a trigger parameter of the trigger. The set value for the trigger parameters varies with and is dependent upon the particular portion of the visual representation that is designated by the graphical user input. The trigger is then employed in connection with subsequent monitoring of signals within the test and measurement device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
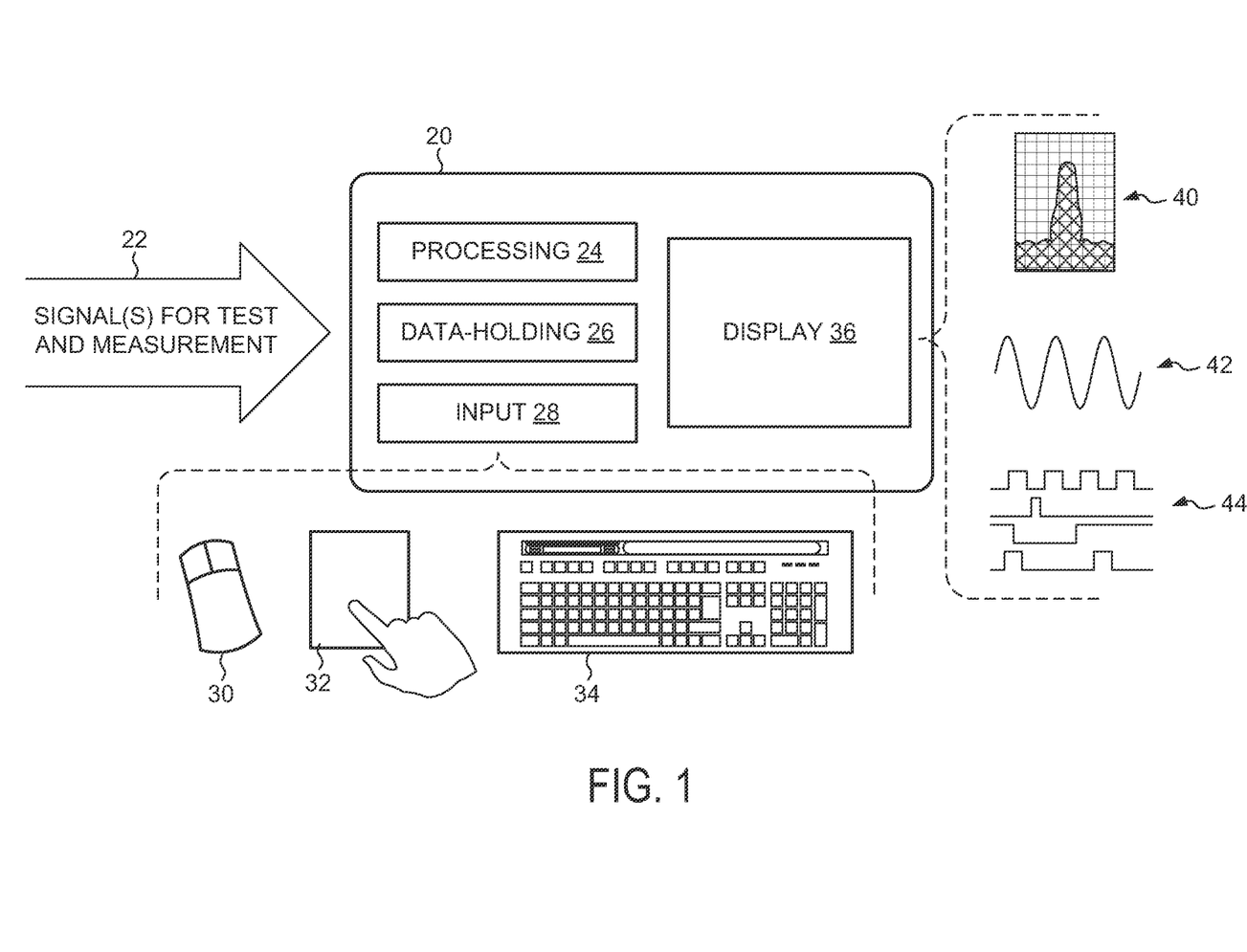
FIGS. 1 and 2 are schematic depictions of embodiments of a test and measurement system with graphically-actuated triggering functionality.

Referring now to FIG. 1, the figure schematically depicts a test and measurement system 20 according to the present description. As indicated, system 20 is configured to receive one or more signals 22 for test and measurement. System 20 typically includes some form of processing subsystem 24, which may include one or more processors, controllers, etc. for providing processing functionality, such as to conduct triggering or perform other processing operations on signal waveforms in the device. A data-holding subsystem 26 typically is also included, for example to store signal data and/or software code or other instructions executed to provide various functionality.

System 20 may also include an input subsystem 28 for receiving user input. As indicated, input subsystem 28 may include one or more devices/mechanisms for receiving input, including pointing devices such as mouse 30, touch-interactive surface 32 (which may be a display), and/or a key-based mechanism such as keyboard 34. These are but examples; various other interfaces may be employed to receive user input.

A display subsystem 36 may also be included to provide visual output. In particular, it will often be desirable to provide a visual representation of signal properties for signals in system 20. Depending on the particular capabilities and configuration of system 20, different types of visual representations may be employed. As shown in the figure, one example of a visual representation is a bitmap display, such as frequency-domain bitmap 40. This type of display may be employed, for example, when system 20 is implemented to provide spectrum analyzer functionality. Other potential visual representations of signal properties include time-domain representations such as oscilloscope-type representation 42, in which a signal value or parameter is displayed as a function of time or some other variable, and/or a logic analyzer-type representation 44, in which signal traces are displayed for one or more digital signals. The visual representations 40, 42 and 44 are exemplary in nature, and it will be appreciated that a variety of other types of visual representation may be employed. The visual representations may be used to facilitate a novel way of enabling a user to configure and run a triggering operation in a test and measurement device. In particular, as will be described below, triggers may be defined and implemented automatically in response to a user's graphic designation of observed phenomena shown on a signal display.

From the above, it should be appreciated that system 20 may take various forms and/or be implemented in different types of devices. Non-limiting examples include spectrum analyzers, oscilloscopes, bus analyzer, packet analyzers, logic analyzers, multimeters, probes and the like. Moreover, it will be further appreciated that a given implementation or device may include hardware and/or software components in addition to those referenced in FIG. 1.

Figure 2:
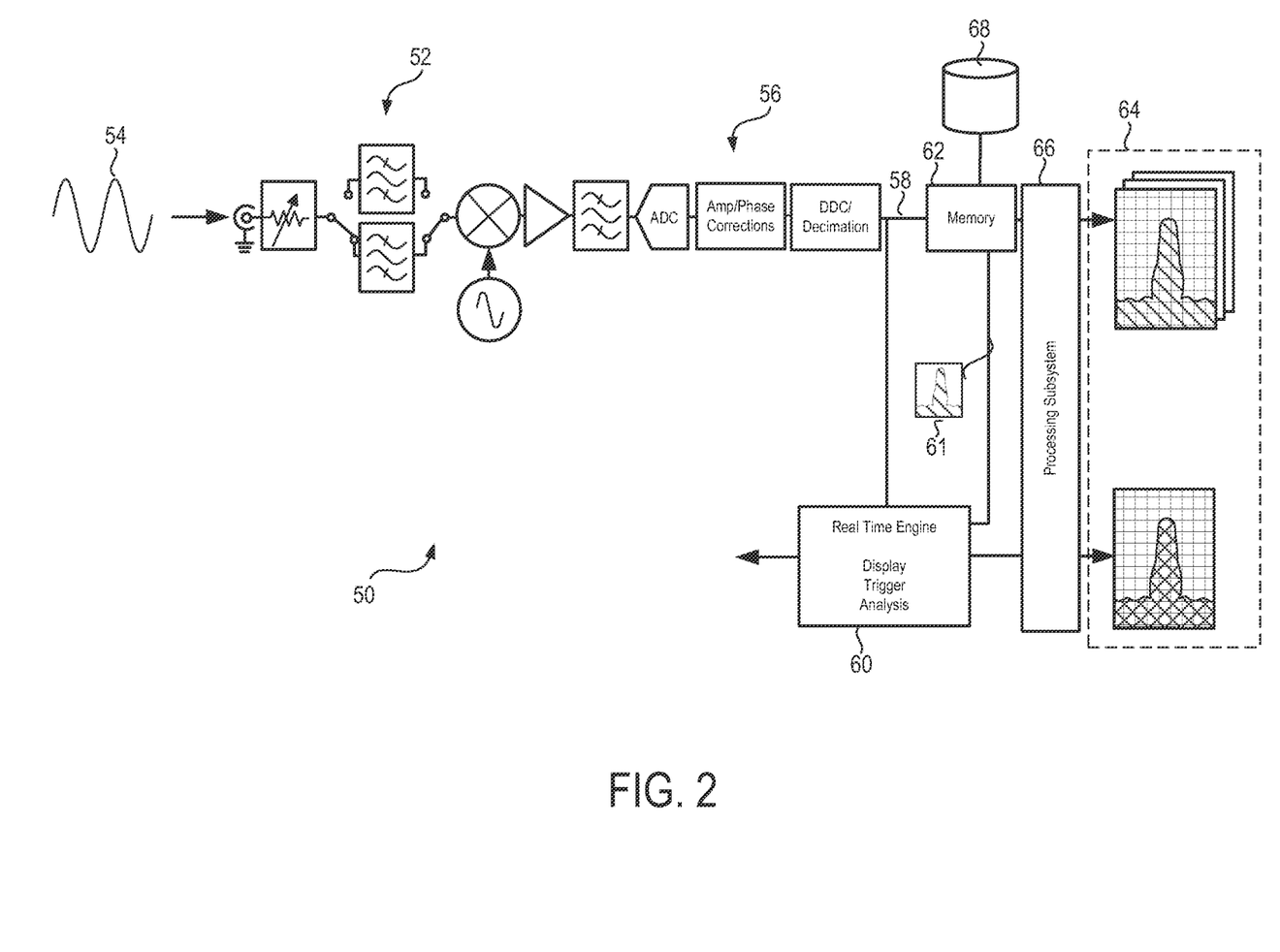

Referring now to FIG. 2, a more specific example will be discussed with reference to a device configured to perform various frequency-domain transformation operations and provide visual representations of signal properties in the form of frequency-domain bitmaps. In particular, the figure depicts a further embodiment of a signal test and measurement system 50 according to the present description. System 50 includes a front end 52 for receiving a time-varying signal 54 (or signals) and for optionally performing various processing operations on the incoming signal. Optional processing may include filtering, mixing, down-conversion, etc. As indicated, additional components 56 may be employed to convert the incoming signal into digital form, and to perform decimation operations and/or make phase and amplitude corrections. The depicted configuration is exemplary, and those skilled in the art will appreciate that a variety of other arrangements may be employed.

At node 58 in the signal path, the signal(s) exists as a digitally processed version of time-varying signal 54. This is applied in turn to real-time engine processing block 60. Among other things, block 60 is configured to repeatedly generate digital frequency domain spectrums 61 based on the time-varying signal 54. Spectrum generation may be performed using any number of digital frequency transform techniques, including chirp-z, FFT and variable-length FFT.

System 50 also includes a memory subsystem 62, which is operatively coupled (e.g., via a bus) with the front-end blocks and the real time block 60. Furthermore, system 50 typically also includes a display subsystem 64 and a processing subsystem 66. As discussed further below, memory subsystem 62 may provide a data store containing a frequency domain bitmap constructed from spectrums 61. System 50 may also include physically or logically separate storage location 68, which may be employed for storage of signals that will be subjected to detailed offline analysis. Memory subsystem 62 and storage location 68 may form portions of a storage or data-holding subsystem, which may include one or more components in addition to those in the depicted example.

Generally, memory subsystem 62 is configured to provide memory space for supporting real-time functionality of system 50. For example, a portion of time-varying signal 54 typically is retained in memory while frequency domain transformation and other real-time operations are performed at block 60. One reason for the retention is to enable a portion of the time-varying signal to be captured and analyzed more extensively offline, for example using processing operations that are more intensive and resource-consumptive than could be performed during real time processing. Setting aside a portion of the time-varying signal in this manner may be referred to as an "analysis capture." Such a set-aside typically is done in response to detection of a triggering event, as will be explained in more detail below.

By combining real-time processing with selectively-triggered offline processing, measurement and test operations can be made more efficient, and scarce computing resources are used only when needed. In one sense, the real time block 60 operates as a screening tool for making decisions about when a more comprehensive analysis should be performed, and on what specific data it should be performed on. Furthermore, triggering can provide substantial efficiency for users, by eliminating trial and error associated with capturing data of interest, and/or by eliminating the need to capture and sift through large amounts of raw or processed data to find signals of interest.

Figure 3:
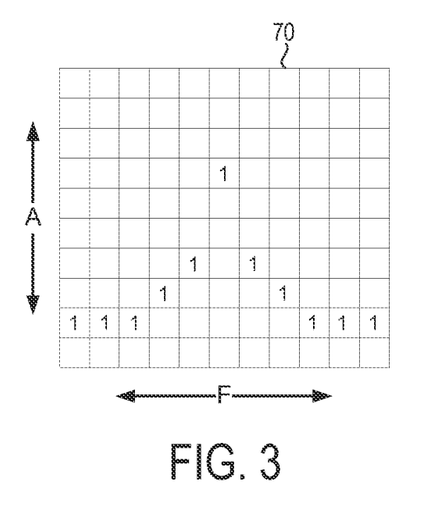
FIGS. 3 and 4 are schematic depictions of exemplary frequency spectrum bitmaps that may be employed in connection with graphic actuation of test and measurement device triggers.

Turning now to FIG. 3, storage of frequency domain information will be discussed. In particular, in many of the examples herein, frequency domain data is stored in a bitmap structure 70, in which quantized amplitude or power level information is expressed as a function of frequency. Typically, information from a plurality of the digital frequency domain spectrums 61 (FIG. 2) will be accumulated into the bitmap data structure. Indeed, in many example embodiments, the bitmap structure 70 is updated and incremented through repeated successive application of the digital frequency domain spectrums as they are generated by block 60 (FIG. 2).

The bitmap typically is generated using a high transform rate, which is desirable in many settings to facilitate detection of infrequent events. Though desirable for event detection, the high rate will often be too fast for the display device or devices used in connection with subsystem 64 (FIG. 2) to display the bitmap data, and will normally be well beyond what human eyes can perceive. Accordingly, the incoming transforms are written into the database at full speed and then transferred to the screen at a viewable rate. For example, the display may be driven by sampling the database 10, 20, 30 or 60 times a second. These are but examples—other frame rates may be employed.

As demonstrated by the bitmap figures herein, the bitmap structure may be thought of as a grid created by dividing a spectrum graph into rows representing trace amplitude or power values and columns for points or ranges on the frequency axis. Each cell in the grid contains a count of how many times it was hit by an incoming spectrum. By tracking and applying a visual coding to these counts (e.g., a mapping of count values to intensity or hue), the system allows the user to visually distinguish rare transients from normal signals and background noise. The reader will appreciate that the bitmap figures herein provide simplified demonstrative examples, and that the actual embodiment of the database(s) stored in memory subsystem 32 will likely contain hundreds of columns and rows.

Figure 4:
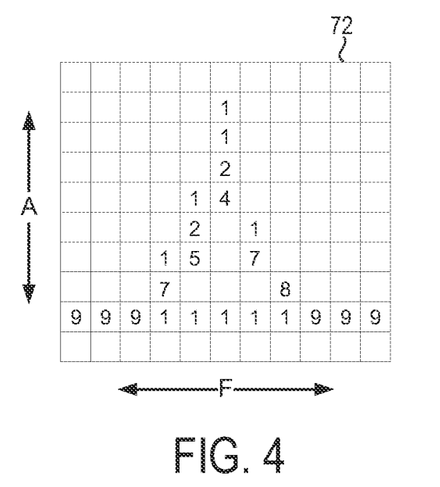

Comparison of FIG. 3 and FIG. 4 shows the relationship between a single digital domain frequency transform and the accumulation of many such transforms into the bitmap database. No accumulation has occurred with respect to FIG. 3—it shows a bitmap representation of a single frequency transform, and indicates the amplitude/power level of the transform for each frequency in the range of interest. More specifically, FIG. 3 shows what the bitmap cells might contain after a single spectrum is mapped into it. Blank cells contain the value zero, meaning that no points from a spectrum have fallen into them yet.

Over time, however, when different samples are taken of the time-varying signal, the individual frequency spectrums will vary and yield different values of frequency and amplitude. The bitmap representation 72 of FIG. 4 shows a bitmap that has been updated (incremented) by applying and storing nine different digital frequency domain transformations in the bitmap. More particularly, the bitmap of FIG. 4 includes the data from the spectrum shown in FIG. 3, but with eight additional spectrums added. The nature of the spectrums applied to the bitmap is that, for each spectrum, some amplitude/power value is indicated for each value along the frequency axis, even if it is a noise floor or other baseline value, or even a value set aside to represent "invalid point". Indeed, in the example of FIG. 4, one of the spectrums was generated while the incoming time-varying signal was absent, as reflected by the string of "1" values at the noise floor.

In some cases it will be desirable to map occurrence values to a color scale, in order to provide an enhanced visual representation of the data. For example, the following color mapping could be used for the nine-spectrum example described above:

| Number of Occurrences | Color |
| --- | --- |
| 0 | Black |
| 1 | Blue |
| 2 | Light blue |
| 3 | Cyan |
| 4 | Green blue |
| 5 | Green |
| 6 | Yellow |
| 7 | Orange |
| 8 | Red orange |
| 9 | Red |

In this example, warmer colors such as red, orange etc. are used to indicate higher numbers of occurrences. This is but an example—a variety of other intensity-grading schemes can be used.

Bitmap hit counts typically are accumulated over time. Because the rate at which spectrums arrive is faster than the display system typically can handle, a "frame" of spectrums (e.g., thousands of spectrums) is accumulated into the bitmap before the next operations are performed on the bitmap. For example, in one embodiment, 48,000 spectrums are applied to the bitmap database each second. Using a frame rate of approximately 33 times per second, the result is that approximately 1400 spectrums are applied to the bitmap database during each display frame. In another embodiment, 292,000 transforms per second are generated, and a 20 Hz frame rate is employed, such that approximately 15,000 spectrums are applied to the bitmap per display frame.

In any case, after a frame has been completed and its count data sent along to the next process, its count values can either be discarded or not. Maintaining the count values from one frame to the next may be referred to as persistence. When persistence is employed, existing counts in the bitmap database are maintained and the power/frequency values of the newly-arriving spectrums are added to increment the counts, rather than simply restarting the counts and replacing them with the values from the most recent frame.

Different types or degrees of persistence may be employed in connection with the storage and display of bitmapped spectrum data. For example, "infinite persistence" refers to maintaining the full accumulated count from each frame to the next, with each succeeding frame adding to the existing counts. On the other hand, "variable persistence" refers to maintaining less than the full count, which can be implemented in various ways, such as by reducing the count by a fixed fraction for each successive display frame.

One situation illustrating persistence and its potential utility is an anomalous signal arising only once during a period of observation. Assume that this signal, although present only once, was present for all 1465 of the spectrum updates in a frame. Assume further that a variable persistence scheme is employed in which the bitmap counts are decremented by 25% each frame. In this example, the affected cells in the bitmap would start out with a value of 1465 and would be displayed full-force when the bitmap database was sampled for display of that initial frame. One frame later, the occurrence values in the affected cells would be decremented by 25% to 1099. Another frame later, they would be decremented to 824, and then smaller and smaller until they become so dim as to be invisible. On the screen, a bright trace would be displayed initially with a spike at the signal frequency. As successive frames are transferred to the display, the part of the displayed spectrum where the signal occurred would diminish (e.g., by fading and/or changing to colors indicating lower density). Meanwhile, the pixels at the noise level would start to brighten below the fading signal. In the end, only a baseline trace would exist at the noise floor.

The spectrum measurement systems and methods described above can provide numerous advantages in a variety of settings. Samples from the time-varying signal are converted into spectrum traces at a high rate so that there is little or no dead time between waveform updates. Furthermore, the spectrum traces are fed to a bitmap database that can be implemented with adjustable parameters to boost the visibility of signal events. As described above, persistence may be implemented in various ways, and the waveform prevalence in different portions of the spectrum may be reflected in the display using various intensity grading and color schemes in connection with the bitmap.

The reader will appreciate that the spectrum-related discussion of FIGS. 2-4 can be extended to accommodate analog frequency domain spectrums. In such a case, the analog spectrums could be sampled and processed so as to produce repeated update of a bitmap data structure. Though the particulars of such a scheme might vary, the general effect would be to provide digitized versions of the analog spectrums. Thus, for purposes of the present discussion, the analog spectrums would yield a plurality of digital frequency domain spectrums (through conversion) that would be repeatedly applied to update the bitmap database.

Regardless of the particular type of test and measurement system, in many cases it will be desirable to identify and trigger upon various types of signal phenomena, conditions, events, etc. A variety of triggering methods exist, including various types of external and internal triggers, level triggering, power triggers, frequency mask triggers and the like. Specific types of triggers may be associated in some cases with particular types of test and measurement devices, and/or with specific ways that signal data is represented or displayed on those devices. For example, numerous well-known trigger types are available for use with oscilloscopes, including edge triggering, pulse-width triggering, glitch triggering, runt triggering, time-out triggering, etc., to name but a few examples.

Figure 5:
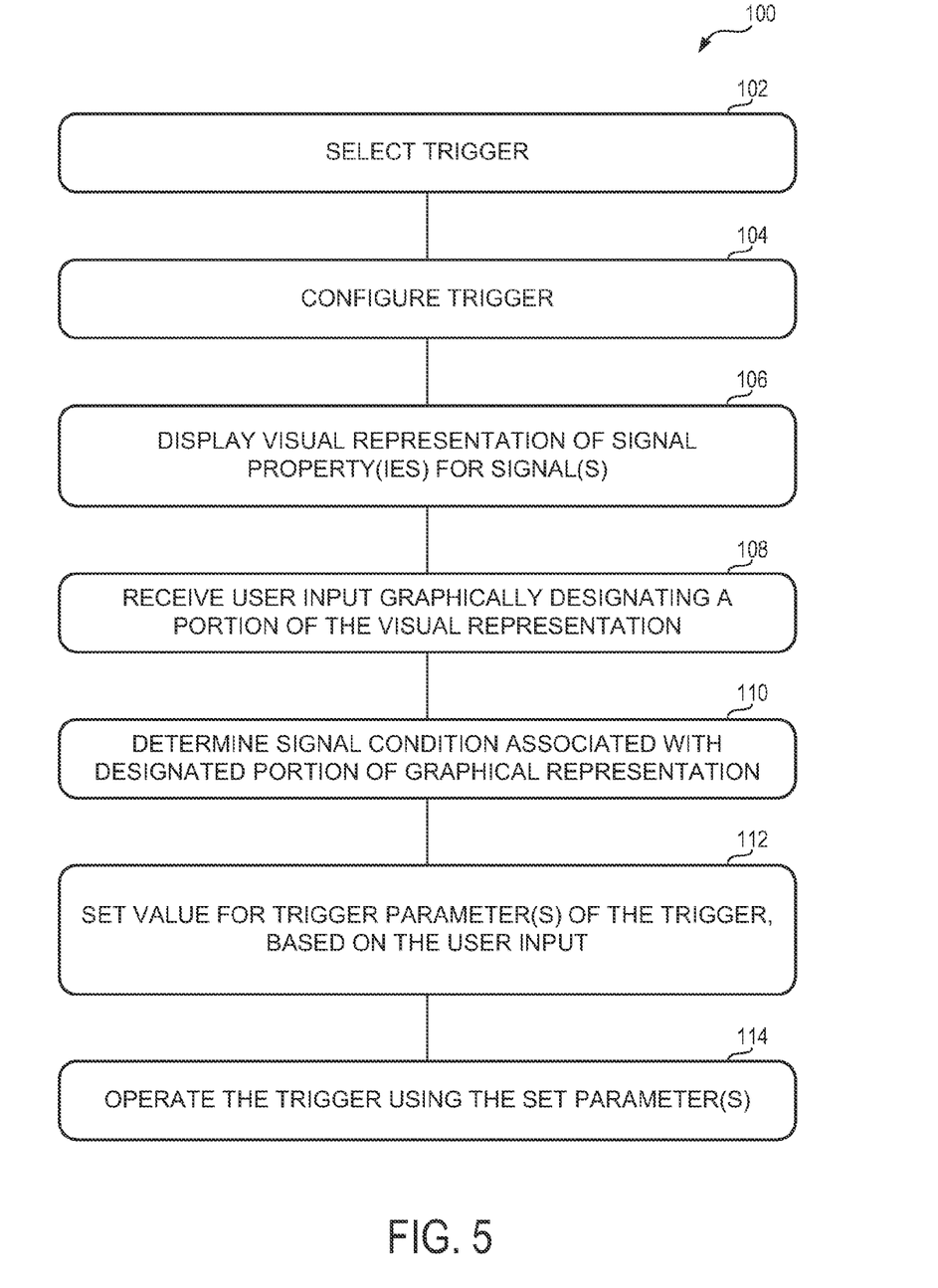
FIG. 5 shows an exemplary method for graphically actuating a triggering operation in a test and measurement device.

Referring now to FIG. 5, the figure depicts an exemplary method 100 for configuring and running a trigger in a test and measurement device. The general method will be described first, followed by description in connection with particular example settings. At steps 102 and 104, the method includes selecting and configuring a trigger that is to be graphically actuated by the user. In some cases, it will be desirable to perform steps 102 and 104 during manufacture or initial configuration of a test and measurement device, or have the steps be automatically performed in response to a particular use scenario, such as when a particular display or operating mode is selected.

At step 106, the method includes displaying a visual representation of a property or properties for one or more signals. As indicated above with various reference to FIGS. 1-4, the visual representation may be of varying types, including time domain, frequency domain, spectral display, analyzer-type display of multiple signals, etc. At step 108, a user input is received. The user input is made graphically in relation to the visual representation of step 106. In particular, the user input causes graphical designation of a portion of the visual representation. The designated portion may be a point or pixel on a display; one or more lines, rows or columns of the display; a rectangle or other bounded region; etc. These are but a few examples.

Based on the user input designation of a portion of the visual representation, a signal condition associated with the designated portion is determined, as shown at 110. As described in more detail below, determining the signal condition may include measuring or calculating a signal property represented in a selected region of the display, such as measuring signal density in an amplitude range of a frequency-domain bitmap. Determining the signal condition may also include identifying or selecting a signal of interest from multiple depicted signals, and then measuring or observing some property of the selected signal, so that the measured property can then be used in setting a value for a trigger parameter. Determination of the signal condition may also include inferring from the user input a time parameter to be employed in the operation of a trigger. Many other examples are possible and contemplated by the present disclosure.

Continuing with method 100, the method may also include setting a value for one or more parameters of the trigger (i.e., the trigger of step 102) based on the user input, as shown at 112. Then, at 114, the trigger may then be operated using the parameter value set via operation of the preceding steps. In particular, subsequent monitoring of time-varying signals may be performed using the set value(s) for the trigger parameter(s).

When implemented in certain settings, method 100 can enable a user to set up and operate a trigger intuitively and easily, simply by pointing to or otherwise graphically designating signal phenomena that the user sees on a display of a test and measurement device. The user is freed from having to manually set trigger parameters or otherwise engage in multi-step operations to enable a trigger. Furthermore, the graphical designation allows the user to create triggers based on signal events that might be difficult to describe or define using previous triggering methods. In addition, this may be implemented so that the trigger is configured automatically in response to the graphical user input without requiring any further input from the user. One approach to automatic graphic enablement of triggers is to pre-select a trigger type that will be used. For example, a specific trigger may be pre-selected from a plurality of available triggers for a test and measurement device. The graphic user input would then be used to extract information from a displayed phenomenon (e.g., a signal pattern for specific signals shown on a logic analyzer display) and use that extracted information to set parameters for the pre-selected trigger (e.g., a digital signal pattern trigger of a logic analyzer).

Figure 6:
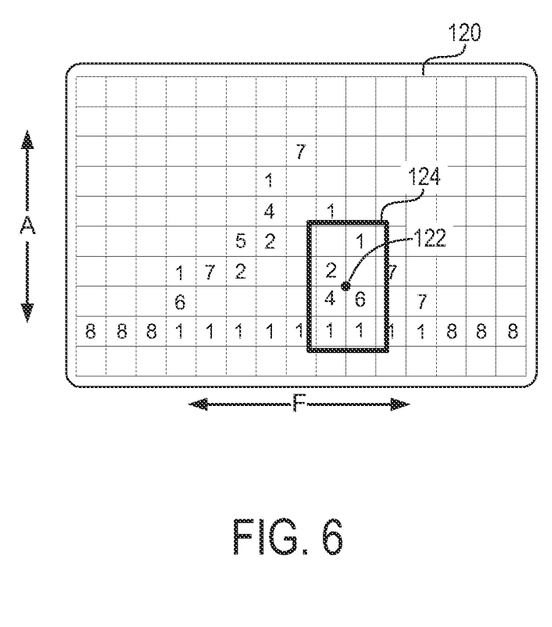
FIGS. 6-12 provide further depiction and examples of methods for graphically actuating triggering operations in a test and measurement device.

Referring now to FIG. 6, an example will be described with reference to a visual representation of signal properties in the form of a frequency-domain bitmap 120. In particular, the user input of FIG. 5 (step 108) may include clicking (e.g., with a mouse) or otherwise designating a point 122 of bitmap 120. Based on the input, a region of the bitmap may be selected, such as a rectangle 124, which is defined in terms of a frequency range and an amplitude range. In one example, the size of rectangle is set to a default height and width. In another example, the user actually draws the box (e.g., with a mouse or other pointing device) to designate the region of interest. For example, the bitmap display might show a transient artifact in a particular region. The user could then draw a box or circle around the artifact in order to activate a trigger based on that artifact.

Figure 7:
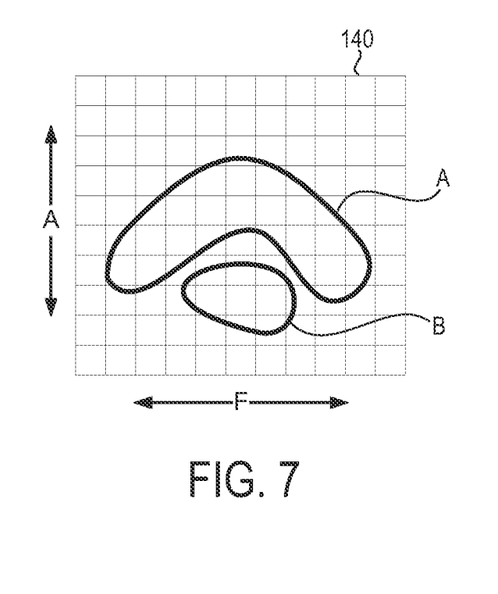

Regardless of the particular way in which the user graphically designates a portion of the display, processing then proceeds to measure a condition in the selected region (e.g., extract information from the graphically-designated signal phenomenon). In one example, a signal density or signal occupancy is measured within the region of interest (e.g., within rectangle 124). In particular, a user may be interested in the relative rate at which a time-varying signal generates frequency spectrum components in a particular region of the spectrum. Referring to FIG. 7, an exemplary frequency-power bitmap spectrum 140 is shown. Assume, for example, that the user expects a "healthy" signal to primarily or exclusively generate components in Region A, with occasional artifacts occurring in Region B. The user may be unconcerned with such artifacts, provided they occur infrequently. Accordingly, the user could define an occupancy threshold, which would result in a trigger (and analysis capture) in the event of increased activity in Region B. From this example, it should be understood that the present systems and methods can be used advantageously to detect spectral events even when they are "surrounded" on the spectral representation by signals of both higher and lower amplitudes, and by signals of greater and lesser prevalence. Furthermore, in many cases a useful trigger can be devised without any prior knowledge of the signal of interest's wave shape in either the time or frequency domain.

Occupancy values may be determined in a variety of ways. In one implementation, occupancy is defined as the number of bitmap cell hits occurring in the selected portion/region, divided by the number of hits that would have occurred if all the transforms from the respective observation period had fallen into the defined portion/region. For example, assume the region of interest defined by frequency F, between amplitude levels $A_{upper}$ and $A_{lower}$. Assume further that 100 spectrums are applied to the bitmap database during the observation interval. If 85 of the spectrums generate an amplitude level between $A_{upper}$ and $A_{lower}$ for frequency F, then the density would be 85/100=0.85, using this measure. If the region of interest were to span a range of frequencies, for example so that it was i cells wide, then that factor would have to be accounted for in the denominator. The resulting calculation would involve dividing the number of occurrences in the region by (100× i) for an average occupancy.

In addition to or instead of occupancy or density, the trigger may be constructed using color characteristics of the bitmap, and/or intensity or hue. It should be appreciated that when a trigger is specified in terms of color, the triggering will thus be dependent upon the intensity grading or color schemes that are used in connection with displaying samples of the bitmap structure. The color criteria may be defined in various ways for the specified area of interest. For example, the triggering criteria might be that a certain percentage of the pixels in the area must be "at least" green, that is green or a color corresponding to a relatively higher number of waveform occurrences. As another example, the criteria might be an "average" color for all the pixels (bitmap cells) in the defined area. These are but examples—other color-based criteria may be employed.

Once the occupancy, color or other property is measured for the selected region, the measured property is converted into a specific value for one or more trigger parameters (e.g., the setting step 112 of FIG. 5). One example in the context of occupancy is to set the trigger to look in the selected region for density occurring at a threshold percentage of the observed density. For example, a trigger could be declared when density in the selected region (e.g., rectangle 124) exceeds (or falls below) 80% of the density that was measured in response to the user input. As indicated in the general discussion of FIG. 5, it may be desirable to pre-configure the method so that an available trigger or trigger type (e.g., density triggering) is automatically selected. This pre-selection could be employed to allow the trigger specification to occur automatically in response to the user input, without requiring any further inputs from the user. In particular, in the case of pre-configuring the graphically-actuated triggering operation to use a density trigger, the user's graphical input would directly and automatically enable a density trigger with a particular density threshold.

Figure 8:
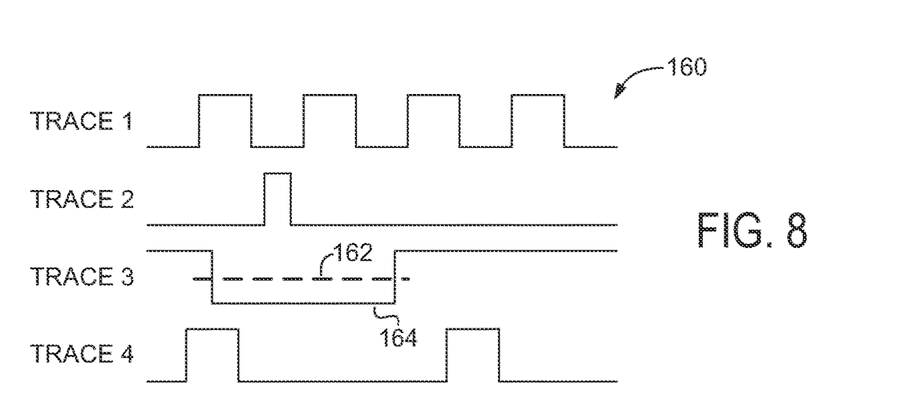
Figure 9:
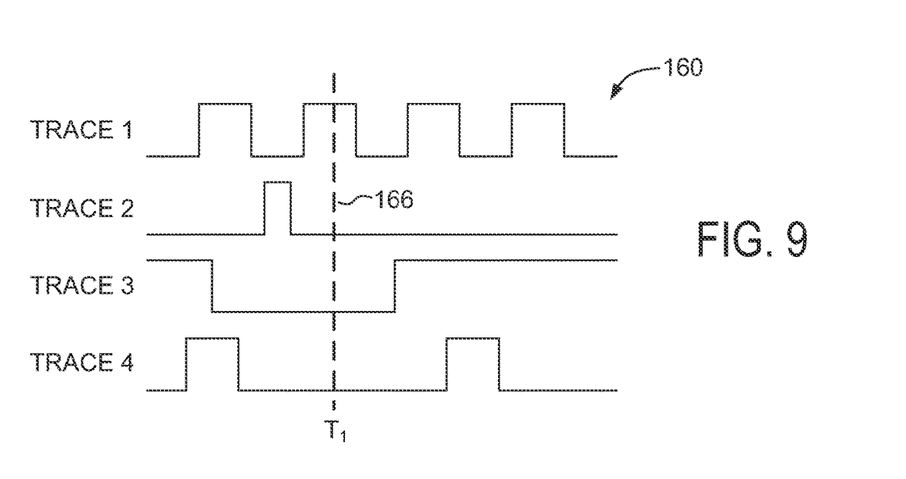
Figure 10:
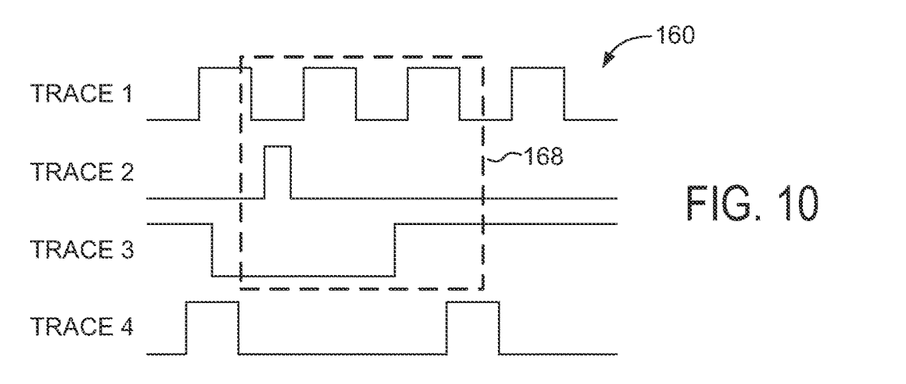

FIGS. 8-10 provide further examples in which a user input graphically applied to a logic analyzer-type visual representation is used to configure and set up a trigger. In particular, each of the figures depicts a visual representation 160 in which signal traces are provided for four digital signals, showing the high and low digital states of the signals as a function of time.

In the example of FIG. 8, the dashed line 162 is the portion of the visual representation which is selected or specified by the graphical user input. Such a designation could occur, for example, in response to the user drawing the dashed line on the signal display (e.g., step 108 of FIG. 5). In the case of a serial trigger, the dashed-line input of FIG. 8 could be used to (1) select the particular signal (Trace 3); (2) cause a measurement of a property or condition of the signal (e.g., the width of pulse 164 or the data pattern of Trace 3 over the period of time represented by the length of the dashed line); and (3) set trigger parameters to enable and run a serial trigger which declares a trigger event upon the occurrence (or non-occurrence) of similar properties during a subsequent observation period for Trace 3.

FIG. 9 provides an example of a state trigger employed in connection with logic analyzer-type visual representation 160. In this case, the portion of the visual representation designated by the user input is indicated by a vertical dashed line 166. From this user input, it is inferred that the user is interested in the state of Traces 1-4 at time $T_1$. At this point in time, the collective state of these traces is (Trace 1=HI, Trace 2=LOW, Trace 3=LOW and Trace 4=LOW). Accordingly, based on the user's graphic designation of this portion of the logic analyzer display, trigger parameters could be set so that a state trigger would declare a trigger upon the occurrence (or non-occurrence) of the observed state of the traces during subsequent monitoring of the traces.

FIG. 10 depicts yet another example, but with reference to a pattern trigger. In this example, the dashed box 168 is the portion of visual representation associated with and specified by the user input. This input causes a pattern trigger to be set based on the observed data pattern for Traces 1-3 during a time period corresponding to the width of the dashed box. In this example, the height of the box is used to infer selection of particular signals (i.e., Traces 1-3), while the width is used to designate a particular data pattern for the selected signals. In response to the graphical user input, processing would occur to identify the data pattern of the selected signals (e.g., corresponding to the signal condition determination of step 110 in FIG. 5), and then the identified data pattern would form the basis for the trigger during subsequent monitoring of the traces.

Figure 11:
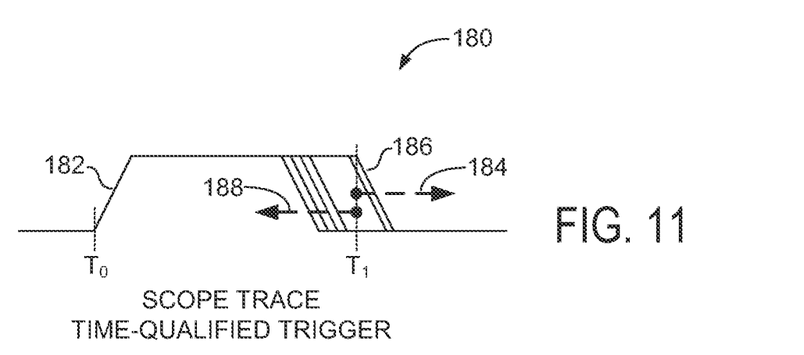

FIG. 11 provides another example of graphically enabling a trigger in response to a user input. In this case, the visual representation of signal properties is an oscilloscope-type representation 180 showing a scope trace for a signal. In particular, the scope trace shows some value for a signal (e.g., voltage) as a function of time. In this example, an initial trigger has been declared in connection with a first signal event, such as rising edge 182 at time $T_0$. A first possibility for the user input described with reference to step 108 and FIG. 5 is the rightward dashed arrow 184 originating at time point $T_1$. The arrow may be drawn using a pointing device or through some other way of graphically designating a portion of the scope display. In this case, the determined signal condition (step 110 of FIG. 5) is a second signal event (e.g., a falling edge 186) occurring after time $T_1$. The triggering specification that the second event should occur after time $T_1$ is inferred via the rightward direction of the dashed arrow 184. Accordingly, the time-qualified trigger is then set to declare triggers when an interval longer than $T_1-T_0$ elapses between the rising edge (first signal event) and the falling edge (second signal event). Another possibility is indicated by leftward dashed arrow 188, which would cause triggering when the duration between events was less than $T_1-T_0$.

Figure 12:
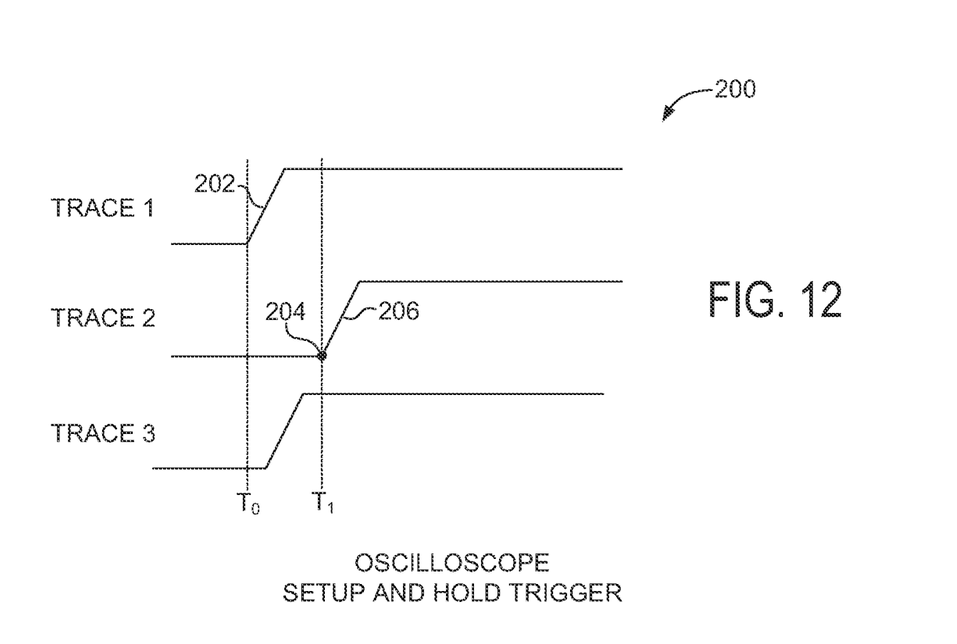

FIG. 12 provides an example of graphically actuating a setup and hold trigger on an oscilloscope-type visual representation 200. In this example, there is an initial trigger with respect to rising edge 202 at time $T_0$ of Trace 1. The user input of step 108 (FIG. 5) is applied to designate a point 204 on Trace 2. This graphic designation correlates to time $T_1$. Then, during operation, if the signal corresponding to Trace 2 crosses an amplitude threshold (e.g., rising edge 206) after the initial trigger (the rising edge of Trace 1) but before lapse of the interval $T_1-T_0$, then a final trigger is declared. In this case, interpreting the graphical user input includes inferring the decision time or interval $T_1-T_0$ and which signal to test for the trigger (Trace 2 in this example). These parameters are determined and then set for the trigger based on the user specifying a particular point on the visual scope representation 200. A further implementation in the examples of FIGS. 11 and 12 is to infer amplitude thresholds from the user inputs. In particular, the vertical positions of dashed lines 184 and 188, or of point 204, may be used to infer or set an amplitude specification in connection with a graphically-actuated trigger.

It will be appreciated that the embodiments and example methods described herein may be implemented, for example, via computer-executable instructions or code, such as programs, stored on a computer-readable storage medium and executed by a computing device. In particular, and for example, the methods described herein may be implemented via trigger instructions or other instruction sets executable by a processing subsystem, such as the processing subsystems shown in FIGS. 1 and 2. Generally, "instructions" or "programs" include routines, objects, components, data structures, and the like that perform particular tasks or implement particular abstract data types. The terms "program" or "instructions" may connote a single program or multiple programs or instruction sets acting in concert, and may be used to denote applications, services, or any other type or class of program. Likewise, the terms "computer" and "computing device" as used herein include any device that electronically executes one or more programs or instruction sets.

It will further be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of any of the above-described processes is not necessarily required to achieve the features and/or results of the embodiments described herein, but is provided for ease of illustration and description.

The subject matter of the present disclosure includes all novel and nonobvious combinations and subcombinations of the various processes, systems and configurations, and other features, functions, acts, and/or properties disclosed herein, as well as any and all equivalents thereof.

What is claimed is:

1. A method of configuring and running triggering operations in a real-time spectrum analyzer comprising:
   receiving a first time-varying signal from a device under test;
   generating a frequency-domain bitmap based on a plurality of frequency domain spectrums from the first time-varying signal, such that the frequency domain bitmap indicates a number of occurrences of amplitudes for each frequency of the frequency domain bitmap over a period of time;
   displaying, on a display of the real-time spectrum analyzer, the frequency-domain bitmap;
   receiving a user input that graphically designates a portion of the frequency domain bitmap;
   determining, by the real-time spectrum analyzer, a signal condition associated with the graphically designated portion of the frequency domain bitmap;
   setting, for a trigger of the real-time spectrum analyzer, a value of a trigger parameter based on the determined signal condition;
   monitoring a second time-varying signal for trigger occurrences using the value of the trigger parameter;
   detecting an occurrence of the trigger within the second time varying signal; and
   in response to detecting the occurrence of the trigger, storing at least a part of the second time-varying signal in a data-holding subsystem of the real-time spectrum analyzer for additional offline processing.

2. The method of claim 1, wherein generating the frequency-domain bitmap from the first time-varying signal further comprises:
   sampling the first time-varying signal at different points in time;
   generating the plurality of frequency domain spectrums based on the sampling.

3. The method of claim 1, wherein the signal condition is a signal occupancy in a region of the frequency domain bitmap defined based on the graphically designated portion of the frequency domain bitmap, and wherein the signal occupancy is based on the number of times the first time-varying signal occurs within the region.

4. The method of claim 1, wherein determining the signal condition includes measuring or calculating the property of the graphically designated portion of the frequency domain bitmap.

5. The method of claim 1, wherein the first time-varying signal and the second time-varying signal are a first portion and a second portion, respectively, of the same time-varying signal that occur over different time-frames, and wherein storing at least the part of the second time-varying signal in a data-holding subsystem of the real-time spectrum analyzer comprises storing the second portion in the data-holding subsystem.

6. The method of claim 1, wherein the frequency domain bitmap visually distinguishes between a number of occurrences of frequencies and corresponding amplitudes included within the first time-varying signal over a period of time.

7. The method of claim 1, wherein the graphically designated portion identifies a phenomenon of the time varying signal represented in the frequency domain bitmap.

8. The method of claim 1, further comprising:
   configuring an occupancy threshold,
   wherein determining the signal condition associated with the graphically designated portion of the frequency domain bitmap includes determining a signal occupancy associated with the graphically designated portion of the frequency domain bitmap, and
   wherein setting the value of the trigger parameter is based on the signal occupancy and the occupancy threshold.

9. The method of claim 1, further comprising selecting the trigger from one of a plurality of available triggers prior to receiving the user input.

10. The method of claim 1, where the setting of the value of the trigger parameter is performed automatically upon receiving the user input, and without requiring any further user input.

11. One or more non-transitory computer-readable storage media having computer-executable instructions stored thereon, which, when executed by a real-time spectrum analyzer configure the real-time spectrum analyzer to:
   generate a frequency-domain bitmap based on a plurality of frequency domain spectrums of a first time-varying signal received from a device under test, such that the frequency domain bitmap indicates a number of occurrences of amplitudes for each frequency of the frequency domain bitmap over a period of time;
   receive user input that graphically selects a region of interest of the frequency domain bitmap displayed on a display of the real-time spectrum analyzer;
   responsive to the user input, determine a signal condition associated with the region of interest based on a property, of the first time-varying signal, depicted within the region of interest;
   set, for a trigger of the real-time spectrum analyzer, a value of a trigger parameter based on the signal condition
   monitor a second time-varying signal for trigger occurrences using the value of the trigger parameter;
   detect an occurrence of the trigger within the second time varying signal; and
   in response to the detection of the occurrence of the trigger, store at least a part of the second time-varying signal in a data-holding subsystem of the real-time spectrum analyzer for additional offline processing.

12. The one or more non-transitory computer-readable media of claim 11, wherein the frequency domain bitmap visually distinguishes between a number of occurrences of frequencies and corresponding amplitudes included within the first time-varying signal.

13. The one or more non-transitory computer-readable media of claim 11, wherein the instructions further configure the real-time spectrum analyzer to:
   configuring an occupancy threshold,
   wherein the signal condition is a signal occupancy, and
   wherein to set the value of the trigger parameter is based on the signal occupancy and the occupancy threshold.

14. The one or more non-transitory computer-readable media of claim 11, wherein to determine the signal condition includes measurement or calculation of a signal occupancy of the first time-varying signal within the region of interest.

15. A real-time spectrum analyzer, configured to:
   receive a first time-varying signal from a device under test;
   generate a frequency-domain bitmap based on a plurality of frequency domain spectrums from the first time-varying signal, such that the frequency domain bitmap indicates a number of occurrences of amplitudes for each frequency of the frequency domain bitmap over a period of time;

display the frequency domain bitmap on a display of the real-time spectrum analyzer;

receive a user input that graphically selects a portion of the frequency domain bitmap; and determine, in response to the user input, a signal condition associated with the graphically selected portion of the frequency domain bitmap;

set, for a trigger of the real-time spectrum analyzer, a value of a trigger parameter based on the determined signal condition monitor a second time-varying signal for trigger occurrences using the value of the trigger parameter;

detect an occurrence of the trigger within the second time varying signal; and in response to the detection of the occurrence of the trigger, store at least a part of the second time-varying signal in a data-holding subsystem of the real-time spectrum analyzer for additional offline processing.

16. The real-time spectrum analyzer of claim 15, wherein the real-time spectrum analyzer is further configured to:

determine an occupancy threshold, wherein the signal condition is a signal occupancy that is based on the number of times the first time-varying signal occurs within a region of the frequency domain bitmap identified by the graphically selected portion, and wherein to set the value of the trigger parameter is based on the signal occupancy and the occupancy threshold.

17. The real-time spectrum analyzer of claim 15, wherein to generate the frequency-domain bitmap from the first time-varying signal the real-time spectrum analyzer is further configured to: generate frequency domain spectrums based on the first time-varying signal, and wherein the frequency domain bitmap is generated based on the frequency domain spectrums.

18. The real-time spectrum analyzer of claim 15, wherein to determine the signal condition includes measuring or calculating the property of a region of the frequency domain bitmap that is identified based on the graphically selected portion.

19. The real-time spectrum analyzer of claim 18, wherein the first time-varying signal and the second time-varying signal are a first portion and a second portion, respectively, of the same time-varying signal that occur over different time frames, and wherein to store at least the part of the second time-varying signal in a data-holding subsystem of the real-time spectrum analyzer comprises storing the second portion in the data-holding subsystem.

20. The real-time spectrum analyzer of claim 18, wherein the frequency domain bitmap visually distinguishes between a number of occurrences of frequencies and corresponding amplitudes included within the first time-varying signal over a period of time.

21. The real-time spectrum analyzer of claim 15, further configured to: receive a selection from a user of a trigger of a plurality of available triggers prior to receiving the user input.

22. The real-time spectrum analyzer of claim 21, wherein the signal condition is a signal occupancy in a region of the frequency domain bitmap defined based on the graphically selected portion of the frequency domain bitmap, and wherein the signal occupancy is based on the number of times the first time-varying signal occurs within the region.

* * * * *